United States Patent
Momose

(10) Patent No.: US 9,318,720 B2
(45) Date of Patent: Apr. 19, 2016

(54) PHOTOELECTRIC CONVERSION DEVICE AND METHOD FOR PRODUCING THE SAME

(71) Applicant: FUJITSU LIMITED, Kawasaki-shi, Kanagawa (JP)

(72) Inventor: Satoru Momose, Atsugi (JP)

(73) Assignee: FUJITSU LIMITED, Kawasaki (JP)

( * ) Notice: Subject to any disclaimer, the term of this patent is extended or adjusted under 35 U.S.C. 154(b) by 0 days.

(21) Appl. No.: 14/230,760

(22) Filed: Mar. 31, 2014

(65) Prior Publication Data
US 2014/0209173 A1  Jul. 31, 2014

Related U.S. Application Data

(63) Continuation of application No. PCT/JP2011/074124, filed on Oct. 20, 2011.

(51) Int. Cl.
*H01L 31/00* (2006.01)
*H01L 51/42* (2006.01)
(Continued)

(52) U.S. Cl.
CPC .......... *H01L 51/4273* (2013.01); *B82Y 10/00* (2013.01); *H01L 51/0003* (2013.01);
(Continued)

(58) Field of Classification Search
CPC ............ H01L 51/2473; H01L 51/4253; H01L 51/424; H01L 51/0003; H01L 51/003–51/0039; H01L 51/0043; H01L 51/0047; Y02E 10/549
See application file for complete search history.

(56) References Cited

U.S. PATENT DOCUMENTS 5,331,183 A    7/1994  Sariciftci et al.
5,454,880 A   10/1995  Sariciftci et al.
(Continued)

FOREIGN PATENT DOCUMENTS

JP    2010-263039    11/2010
JP    2011-187852     9/2011
WO    2010/120082    10/2010

OTHER PUBLICATIONS

Yanming Sun et al., Advanced Materials; "Efficient, Air-Stable Bulk Heterojunction Polymer Solar Cells Using MoOx as the anode Interfacial Layer", vol. 23, No. 19, pp. 2226-2230, May 17, 2011.
(Continued)

*Primary Examiner* — Allison Bourke
*Assistant Examiner* — Niki Bakhtiari
(74) *Attorney, Agent, or Firm* — Fujitsu Patent Center

(57) ABSTRACT

Provided is a photoelectric conversion device which includes a positive electrode, a negative electrode, a photoelectric conversion layer including poly-[N-9''-heptadecanyl-2,7-carbazole-alt-5,5-(4',7'-di-2-thienyl-2',1',3'-benzothiadiazole)] as a p-type organic semiconductor material and fullerene or a fullerene derivative as an n-type organic semiconductor material; and a buffer layer, provided between the positive electrode and the photoelectric conversion layer, including $MoO_3$, in which device the proportion of the p-type organic semiconductor material in a first region being in contact with the buffer layer in the photoelectric conversion layer is higher than the proportion of the p-type organic semiconductor material in the entirety of the photoelectric conversion layer, and the proportion of the p-type organic semiconductor material in a second region on the negative electrode side than the first region in the photoelectric conversion layer is lower than the proportion of the p-type organic semiconductor material in the entirety of the photoelectric conversion layer.

2 Claims, 16 Drawing Sheets

(51) Int. Cl.
*H01L 51/00* (2006.01)
*B82Y 10/00* (2011.01)

(52) U.S. Cl.
CPC ........ *H01L 51/0036* (2013.01); *H01L 51/0039* (2013.01); *H01L 51/0043* (2013.01); *H01L 51/0047* (2013.01); *H01L 51/4253* (2013.01); *H01L 2251/308* (2013.01); *Y02E 10/549* (2013.01); *Y02P 70/521* (2015.11)

(56) References Cited

U.S. PATENT DOCUMENTS

2012/0031493 A1   2/2012   Lee et al.
2012/0055536 A1   3/2012   Saito et al.

OTHER PUBLICATIONS

Akinobu Hayakawa et al., Applied Physics Letters 90, 163517; "High performance Polythiophene/fullerene bulk-heterojunction solar cell with a TiOx hole blocking layer" (2007).

Bertrand Tremolet De Villers et al., The Journal of Physical Chemistry C Letters; "Improving the Reproducibility of P3HT:PCBM solar Cells by Controlling the PCBM/Cathode Interface"; vol. 113, No. 44, pp. 18978-18982 (2009).

Zheng Xu et al., Advanced Functional Materials; "Vertical Phase Separation in Poly (3-hexylthiophene): Fullerene Derivative Blends and its Advantage for Inverted Structure Solar Cells", pp. 1227-1234 (2009).

International Search Report, mailed in connection with PCT/JP2011/074124 and mailed Nov. 22, 2011.

CNOA—Chinese Office Action dated Dec. 3, 2015 for the corresponding Chinese Application No. 201180074244.9, with English translation.

PHOTOELECTRIC CONVERSION DEVICE AND METHOD FOR PRODUCING THE SAME

CROSS-REFERENCE TO RELATED APPLICATION

This application is a continuation application of International Application PCT/JP2011/074124, filed on Oct. 20, 2011 and designated the U.S., the entire contents of which are incorporated herein by reference.

FIELD

The embodiments discussed herein are related to a photoelectric conversion device and a method for producing the same.

BACKGROUND

An organic thin film type solar cell uses a photoelectric conversion layer combining a p-type organic semiconductor polymer and an n-type organic semiconductor exemplified by fullerene, and is configured to provide charge separation when an exciton produced by incident light arrives at a contact point of the p-type organic semiconductor polymer and the n-type organic semiconductor.

In such an organic thin film type solar cell, a bulk heterojunction (BHJ) type photoelectric conversion layer is frequently used. This is referred to as a bulk heterojunction type organic thin film solar cell.

Such a bulk heterojunction type photoelectric conversion layer is formed by applying a mixed solution, which consists of a p-type organic semiconductor, an n-type organic semiconductor and suitable solvent, and drying the mixed solution. Then, during the course of drying the mixed solution, the p-type organic semiconductor material and the n-type organic semiconductor material respectively spontaneously undergo aggregation and phase separation, and as a result, a p-n junction with a large specific surface area is formed.

Meanwhile, since organic thin film type solar cells can provide high photoelectric conversion efficiency in an indoor environment with a low intensity light, the organic thin film type solar cells can establish a separate realm from the mainstream Si solar cells, and are highly promising.

However, when compared with Si solar cells, the organic thin film type solar cells have a low fill factor (FF), and therefore, under the conditions of actual use, the supply voltage is lowered. That is, as for an organic thin film solar cell, in order to obtain a high output voltage under the conditions of actual use, it is required to achieve a high fill factor, that is, it is required to increase the fill factor.

Thus, in order to increase the fill factor, for example, there has been proposed a method of inserting a $TiO_x$ hole blocking layer between a photoelectric conversion layer including P3HT (poly[3-hexylthiophene]) as a p-type organic semiconductor material and including PCBM ([6,6]-phenyl-$C_{61}$ butyric acid methyl ester) as an n-type organic semiconductor material, and a negative electrode (first method). Furthermore, for example, there has also been proposed a method of applying PCBM on the negative electrode side of a photoelectric conversion layer including P3HT as a p-type organic semiconductor material and includes PCBM as an n-type organic semiconductor material (second method). Furthermore, for example, there has been also proposed a method of using cesium carbonate having very strong polarity in an underlayer that forms a photoelectric conversion layer including P3HT as a p-type organic semiconductor material and including PCBM as an n-type organic semiconductor material, and preferentially depositing PCBM on the underlayer side (negative electrode side) by utilizing the high affinity between cesium carbonate and PCBM (third method).

SUMMARY

According to an aspect of the embodiment, a photoelectric conversion device includes a positive electrode; a negative electrode; a photoelectric conversion layer including poly[N-9''-heptadecanyl-2,7-carbazole-alt-5,5-(4',7'-di-2-thienyl-2',1',3'-benzothiadiazole)] as a p-type organic semiconductor material and including fullerene or a fullerene derivative as an n-type organic semiconductor material; and a buffer layer, provided between the positive electrode and the photoelectric conversion layer, including $MoO_3$, wherein the proportion of the p-type organic semiconductor material in a first region being in contact with the buffer layer in the photoelectric conversion layer is higher than the proportion of the p-type organic semiconductor material in the entirety of the photoelectric conversion layer, and the proportion of the p-type organic semiconductor material in a second region on the negative electrode side than the first region in the photoelectric conversion layer is lower than the proportion of the p-type organic semiconductor material in the entirety of the photoelectric conversion layer.

According to another aspect of the embodiment, a method for producing a photoelectric conversion device includes applying a mixed liquid including poly-[N-9''-heptadecanyl-2,7-carbazole-alt-5,5-(4',7'-di-2-thienyl-2',1',3'-benzothiadiazole)] as a p-type organic semiconductor material and including fullerene or a fullerene derivative as an n-type organic semiconductor material, on a buffer layer including $MoO_3$, drying the mixed liquid at 50° C. or lower, and thereby forming a photoelectric conversion layer.

The object and advantages of the invention will be realized and attained by means of the elements and combinations particularly pointed out in the claims.

It is to be understood that both the foregoing general description and the following detailed description are exemplary and explanatory and are not restrictive of the invention.

DESCRIPTION OF EMBODIMENTS

However, in the above first method, since it is necessary to provide a hole blocking layer formed from a material different from a material that constitutes the photoelectric conversion layer and other materials separately from the photoelectric conversion layer, the production cost increases.

Furthermore, in the above second method, the region of PCBM only, which is applied on the negative electrode side of the photoelectric conversion layer, is formed from a material that constitutes the photoelectric conversion layer, and despite an ability to absorb light, the region of PCBM only does not have a photoelectric conversion function. Therefore, from the viewpoint of increasing the photoelectric conversion efficiency, it cannot be said that the photoelectric conversion layer is effectively utilized. That is, if a material that constitutes the photoelectric conversion layer is used, it is preferable to increase the fill factor while causing the region to function as a photoelectric conversion layer. Furthermore, a process of further applying PCBM after forming a photoelectric conversion layer, is necessitated.

Furthermore, in the above third method, high affinity between cesium carbonate that is provided on the negative electrode side of the photoelectric conversion layer and PCBM as an n-type organic semiconductor material is utilized, and when it is wished to provide a buffer layer on the positive electrode side of the photoelectric conversion layer and to utilize affinity between that material and a p-type organic semiconductor material, this means cannot be directly used. To be more specific, the factor that determines the affinity between materials lies not only in polarity, but also in a wide variety of aspects such as the crystal lattice lengths of the respective materials, the shape of the electron orbitals, and energy levels thereof. Therefore, it is difficult to predict the affinity between materials without depending on experimentation.

Thus, it is intended to increase the fill factor utilizing the affinity between the material of the buffer layer provided on the positive electrode side of the photoelectric conversion layer and the p-type organic semiconductor material.

Hereinafter, the photoelectric conversion device and a method for producing the same according to the present embodiments will be described with reference to the drawings, while making reference to FIG. 1.

The photoelectric conversion device according to the present embodiment is used as, for example, an organic thin film type solar cell, specifically, a bulk heterojunction type organic thin film solar cell.

Figure 1:
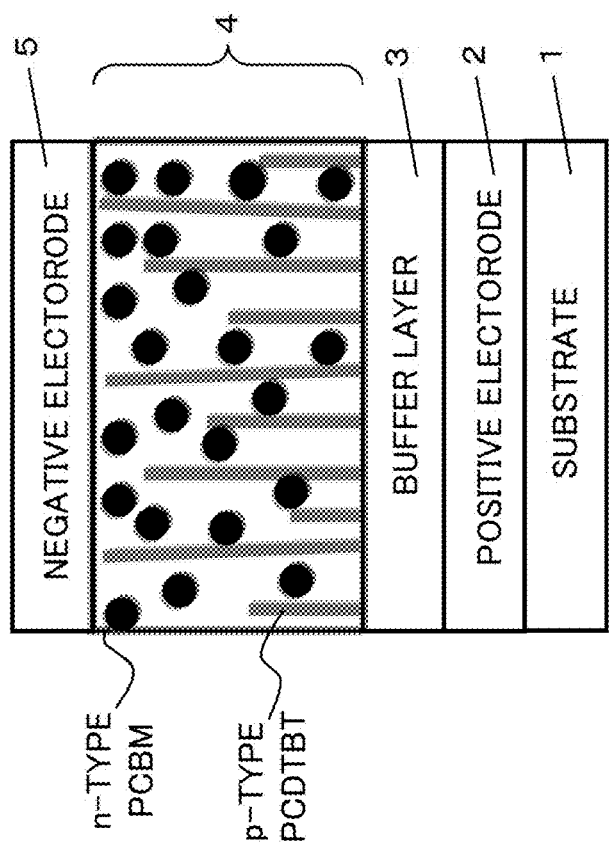
FIG. 1 is a schematic diagram illustrating the configuration of a photoelectric conversion device according to the present embodiment.

The photoelectric conversion device of the present embodiment includes, as illustrated in FIG. 1, a substrate 1; a positive electrode 2 as a lower electrode; a buffer layer 3; a photoelectric conversion layer 4; and a negative electrode 5 as an upper electrode. Meanwhile, the photoelectric conversion layer 4 is also called a photoelectric conversion film.

Here, the substrate 1 is a transparent substrate that transmits incident light, and an example thereof is a glass substrate.

The positive electrode 2 is a transparent electrode that is provided on the substrate 1 and transmits incident light, and an example thereof is an ITO (indium tin oxide) electrode.

The buffer layer 3 is provided on the positive electrode 2, that is, provided between the positive electrode 2 and the photoelectric conversion layer 4, and functions as a hole transport layer. Meanwhile, the buffer layer 3 is also called a positive electrode side buffer layer. Furthermore, the buffer layer 3 is a $MoO_3$ layer, that is, a molybdenum(VI) oxide layer. Meanwhile, the buffer layer 3 may be any layer including $MoO_3$. In addition, $MoO_3$ is also called a hole transporting material.

The photoelectric conversion layer 4 is provided on the buffer layer 3. That is, the photoelectric conversion layer 4 is provided between the buffer layer 3 and the negative electrode 5.

The negative electrode 5 is a metal electrode provided on the photoelectric conversion layer 4, and an example thereof is an aluminum electrode.

In the present embodiment, the photoelectric conversion layer 4 is a bulk heterojunction type photoelectric conversion layer including poly-[N-9"-heptadecanyl-2,7-carbazole-alt-5,5-(4',7'-di-2-thienyl-2',1',3'-benzothiadiazole)] represented by the following formula (1) (hereinafter, also referred to as PCDTBT) as a p-type organic semiconductor material, and including fullerene or a fullerene derivative as an n-type organic semiconductor material. The photoelectric conversion layer 4 as used herein is formed from a mixture of PCDTBT and fullerene or a fullerene derivative.

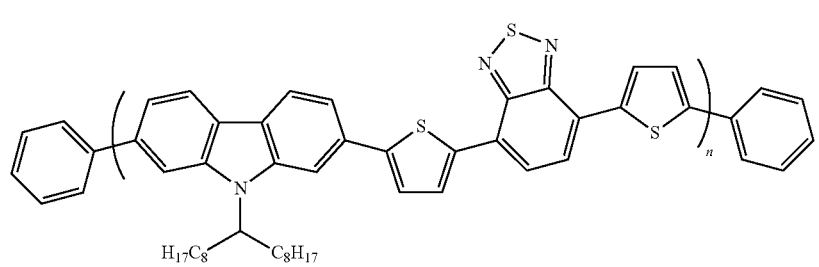

(1)

In the present embodiment, the n-type organic semiconductor material is, for example, [6,6]-phenyl-$C_{71}$ butyric acid methyl ester (PC71BM) represented by the following formula (2), or [6,6]-phenyl-$C_{61}$ butyric acid methyl ester (PC61BM) represented by the following formula (3) (hereinafter, these are referred to as PCBM).

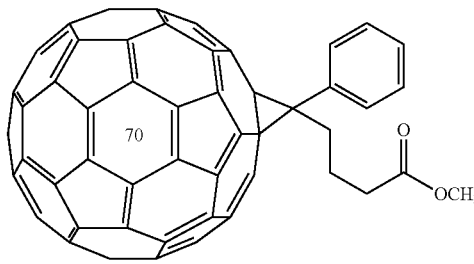

(2)

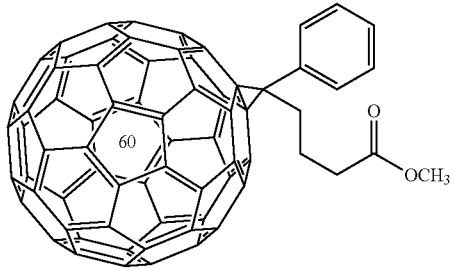

(3)

Meanwhile, the n-type organic semiconductor material is desirably fullerene or a fullerene derivative, which is soluble in organic solvents and is compatible with PCDTBT. Specifically, the n-type organic semiconductor material may include any one material selected from the group consisting of [6,6]-phenyl-$C_{71}$ butyric acid methyl ester, [6,6]-phenyl-$C_{61}$ butyric acid methyl ester, fullerene C60, C70 or C84 represented by the following formula (4), indene-C 60 bisadduct (ICBA) represented by the following formula (5), [6,6] diphenyl $C_{62}$bis(butyric acid methyl ester) represented by the following formula (6), [6,6] diphenyl $C_{72}$bis(butyric acid methyl ester), [6,6]-phenyl-$C_{61}$ butyric acid (3-ethylthiophene) ester represented by the following formula (7), 1-(3-methoxycarbonyl)propyl-1-thienyl-[6,6]-methanofullerene (ThCBM) represented by the following formula (8), and [6,6]-phenyl-$C_{61}$ butyric acid (2,5-dibromo-3-ethylthiophene) ester represented by the following formula (9).

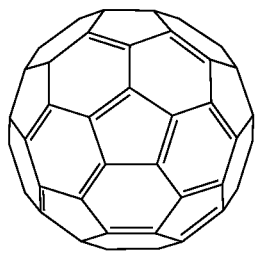

(4)

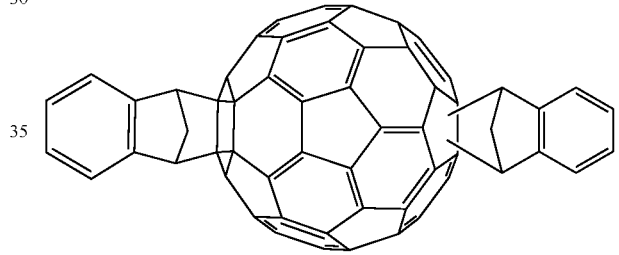

(5)

(6)

(7)

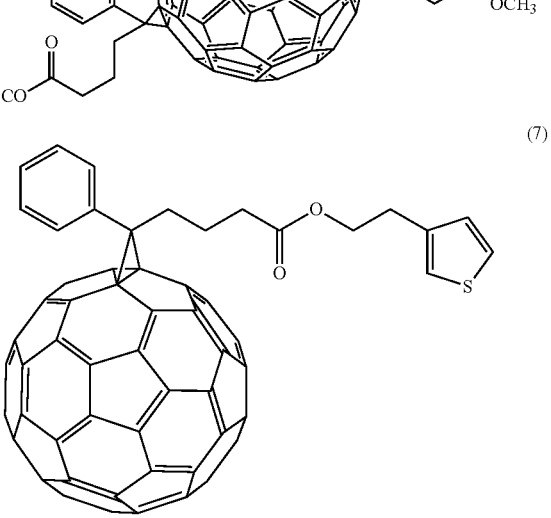

-continued

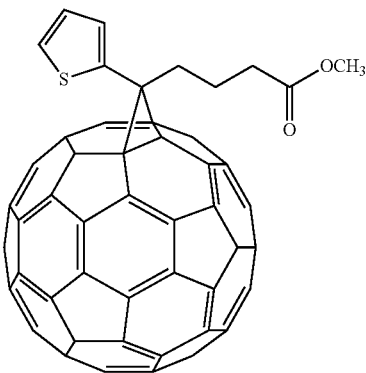
(8)

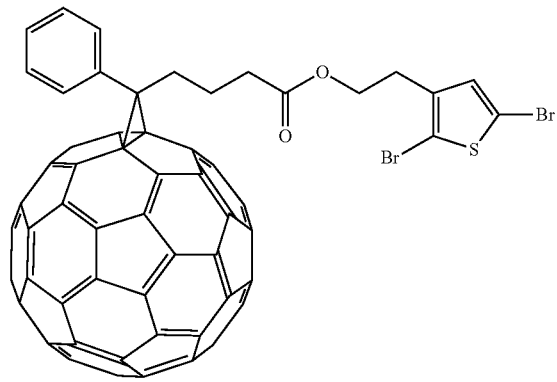
(9)

Furthermore, in the present embodiment, the proportion of the p-type organic semiconductor material in a region (first region) being in contact with the buffer layer 3 in the photoelectric conversion layer 4 is higher than the proportion of the p-type organic semiconductor material in the entirety of the photoelectric conversion layer 4, and the proportion of the p-type organic semiconductor material in a region (second region) on the negative electrode side of the photoelectric conversion layer 4, rather than in the region being in contact with the buffer layer 3, is lower than the proportion of the p-type organic semiconductor material in the entirety of the photoelectric conversion layer 4. Meanwhile, the region (first region) being in contact with the buffer layer 3 in the photoelectric conversion layer 4 is a region on the positive electrode side of the photoelectric conversion layer 4, that is, a region close to the positive electrode 2, or a region in the vicinity of the buffer layer in the photoelectric conversion layer 4. Furthermore, the region (second region) on the negative electrode side than the region being in contact with the buffer layer 3 in the photoelectric conversion layer 4 is a region on the negative electrode side of the photoelectric conversion layer 4, that is, a region close to the negative electrode 5, or a region in the vicinity of the negative electrode in the photoelectric conversion layer 4.

As such, first, since the photoelectric conversion layer 4 has a high ratio (proportion) of PCDTBT as a p-type organic semiconductor material in the vicinity of the MoO₃ buffer layer 3 formed on a transparent electrode that serves as the positive electrode 2, the hole conduction resistance at the interface between the MoO₃ buffer layer 3 and the photoelectric conversion layer 4 is decreased. On the other hand, since the photoelectric conversion layer 4 has a high ratio (proportion) of fullerene or a fullerene derivative (PCBM in this embodiment) as an n-type organic semiconductor material in the vicinity of a metal electrode that serves as the negative electrode 5, the electron conduction resistance at the interface between the metal electrode as the negative electrode 5 and the photoelectric conversion layer 4 is decreased. Thereby, the series resistance of the photoelectric conversion layer 4 is decreased.

Furthermore, the photoelectric conversion layer 4 has a high ratio of PCDTBT as a p-type organic semiconductor material on the positive electrode side where the hole concentration is high, and has a high ratio of fullerene or a fullerene derivative (PCBM in this case) as an n-type organic semiconductor material on the negative electrode side where the electron concentration is high. Therefore, the probability of recombination of electrons and holes is decreased, and the leak current caused by recombination is decreased. Thereby, the parallel resistance of the photoelectric conversion layer 4 is increased.

As such, in the photoelectric conversion layer 4 of the present embodiment, since the series resistance decreases and the parallel resistance increases, the fill factor is increased. Furthermore, in the photoelectric conversion layer 4 of the present embodiment, PCDTBT and fullerene or a fullerene derivative (PCBM in this case) are in a mixed state in the respective regions on the negative electrode side and the positive electrode side, and the photoelectric conversion layer has a photoelectric conversion function. That is, the entirety of the region between the buffer layer 3 and the negative electrode 5 functions as the photoelectric conversion layer 4. Therefore, for example, as compared with the case of applying PCBM on the negative electrode side of the photoelectric conversion layer, the fill factor can be increased, while the entirety of the region between the buffer layer and the negative electrode is allowed to function as a photoelectric conversion layer, by effectively utilizing the materials that constitute the photoelectric conversion layer. Furthermore, as compared with the case of providing a hole blocking layer separately from the photoelectric conversion layer, the production cost can be suppressed to a low level.

However, a significant number of the p-type organic semiconductor materials represented by P3HT are highly crystalline, and when an underlayer having high affinity is used, crystals grow by taking the interface with the underlayer as the starting points. Since the diffusion length of the excitons in an organic semiconductor is about 10 nm, if the crystal size of the p-type organic semiconductor material becomes too large, most of the excitons become useless, and the charge separation efficiency is decreased.

On the contrary, PCDTBT as the p-type organic semiconductor material used in the photoelectric conversion layer 4 of the present embodiment is a polymer compound lacking crystallinity, and in the interior of the photoelectric conversion layer 4, PCDTBT is in a state of disorderly mixed with fullerene or a fullerene derivative (PCBM in this case) as the n-type organic semiconductor material over the entire layer. Furthermore, in a conventional p-type organic semiconductor material, since holes are conducted by hopping between molecules, conduction of holes is difficult in a disorderly mixed state. On the contrary, PCDTBT has both the part working as p-type and the part working as n-type in the main chain, and electron donation occurs from the former to the latter within a molecule. Therefore, holes are conducted in the main chain. Accordingly, when PCDTBT is used as a p-type organic semiconductor material, even if the interior of the photoelectric conversion layer 4 is in a disorderly mixed state, high charge separation efficiency can be realized.

Furthermore, the photoelectric conversion layer 4 of the present embodiment is formed such that, as will be described below, PCDTBT as a p-type organic semiconductor material is preferentially adsorbed (deposited) on the surface of the $MoO_3$ buffer layer 3, but the amount of PCDTBT being adsorbed to the surface of the $MoO_3$ buffer layer 3 is very small relative to the whole. Furthermore, a significant amount of PCDTBT is in a state of being continuous from the surface of the $MoO_3$ buffer layer to the vicinity of the negative electrode. That is, one PCDTBT molecule is in a state of having both the part being adsorbed to the surface of the $MoO_3$ buffer layer 3, and the part being mixed with the n-type organic semiconductor material in the surroundings. Such a state is very advantageous for realizing high charge separation efficiency, high charge transport efficiency, low probability of charge recombination, and low series resistance all at the same time in PCDTBT having a high ability to conduct holes in the main chain. That is, high charge separation efficiency, high charge transport efficiency, and high fill factor are simultaneously realized by PCDTBT that exists in such a state to a large extent at the surface of the $MoO_3$ buffer layer 3, and thus a photoelectric conversion layer having high photoelectric conversion efficiency can be realized.

As such, PCDTBT as a p-type organic semiconductor material can make the proportion of PCDTBT on the positive electrode side higher by utilizing the high affinity with the $MoO_3$ buffer layer 3 that is provided on the positive electrode side of the photoelectric conversion layer 4, and also has a feature of being non-crystalline and enabling hole conduction in the main chain. Therefore, when PCDTBT is used as a p-type organic semiconductor material of the photoelectric conversion layer 4, the fill factor and the photoelectric conversion efficiency can be increased very effectively.

Furthermore, for example, since P3HT that is used as a p-type organic semiconductor material in a photoelectric conversion layer has a relatively high energy level of the highest occupied molecular orbital (HOMO), it is not easy to increase the open circuit voltage of the photoelectric conversion device. On the contrary, since PCDTBT has an energy level of HOMO lower by about 0.3 eV compared with P3HT, the open circuit voltage of the photoelectric conversion device can be increased. As such, PCDTBT having a lower energy level of HOMO is used as the p-type organic semiconductor material, the open circuit voltage and the photoelectric conversion efficiency can be increased.

Furthermore, the range of selection of the transparent electrode material that can be provided on the transparent substrate of a photoelectric conversion device is limited. Therefore, in reality, it is easier to increase the work function of the metal electrode, rather than to increase the work function of the transparent electrode. Therefore, it is easier to obtain a high output voltage when a transparent electrode is used as a positive electrode and a metal electrode is used as a negative electrode as in the present embodiment, compared to the case of using a transparent electrode as a negative electrode and using a metal electrode as a positive electrode as in the third method described above.

Next, the method for producing a photoelectric conversion device according to the present embodiment will be described.

First, a positive electrode 2 (transparent electrode) is formed on a substrate 1 (transparent substrate).

Next, a buffer layer 3 including $MoO_3$ is formed on the positive electrode 2.

Subsequently, a photoelectric conversion layer 4 is formed on the buffer layer 3 including $MoO_3$.

That is, on the surface of the buffer layer 3 including $MoO_3$ formed on the positive electrode 2, a mixed liquid (mixed solution) including PCDTBT as a p-type organic semiconductor material and including fullerene or a fullerene derivative (PCBM in this case) as an n-type organic semiconductor material is applied (applying step), the mixed liquid is dried at about 50° C. or lower (drying step), and thus the photoelectric conversion layer 4 is formed. Thereby, a bulk heterojunction type photoelectric conversion layer 4 in which the proportion of PCDTBT is high on the positive electrode side, and the proportion of fullerene or a fullerene derivative (PCBM in this case) is high on the negative electrode side, can be spontaneously formed. As such, only by using one kind of mixed liquid and applying the mixed liquid once, a bulk heterojunction type photoelectric conversion layer 4 having a high proportion of PCDTBT on the positive electrode side and having a high proportion of fullerene or a fullerene derivative (PCBM in this case) on the negative electrode side can be spontaneously formed. Therefore, it is easy to form the photoelectric conversion layer 4.

Here, a bulk heterojunction type photoelectric conversion layer 4 having a high proportion of PCDTBT on the positive electrode side and having a high proportion of PCBM on the negative electrode side is spontaneously formed by utilizing the affinity between $MoO_3$ which is the material of the buffer layer 3 provided on the positive electrode side of the photoelectric conversion layer 4, and PCDTBT which is the p-type organic semiconductor material of the photoelectric conversion layer 4.

That is, $MoO_3$ that serves as a base upon forming the photoelectric conversion layer 4 is a metal oxide which is not as strong as a highly hydrophilic salt such as cesium carbonate, but has polarity at the surface.

Furthermore, PCDTBT as the p-type organic semiconductor material is generally a p-type material, but since it has both a part working as p-type (thiophene ring, carbazole ring) and a part working as n-type (benzothiadiazole ring) in the main chain, a certain dipole moment exists in the main chain. That is, PCDTBT as the p-type organic semiconductor material is not as strong as such, but has polarity.

On the other hand, PCBM as the n-type organic semiconductor material hardly has polarity as a single molecule, but since the electron density is very high, it is speculated that in an aggregated state, strong polarization occurs as a result of an interaction between molecules. During the process of forming a photoelectric conversion layer, since PCBM is in an aggregated state, if a strongly polar base is available, PCBM is deposited preferentially on that surface.

However, the polarity of the surface of $MoO_3$ that serves as a base when the photoelectric conversion layer 4 is formed is not so as strong.

Therefore, PCDTBT having a polarity of a medium extent is preferentially deposited on $MoO_3$, and PCBM is rather excluded from the surface of $MoO_3$. As a result, a bulk heterojunction type photoelectric conversion layer 4 having a high proportion of PCDTBT on the positive electrode side, that is, the side of the buffer layer including $MoO_3$, and having a high proportion of PCBM on the negative electrode side, is spontaneously formed.

Particularly, as described above, when a mixed liquid of PCDTBT and PCBM is applied on a $MoO_3$ layer 3 and then dried at about 50° C. or lower, a bulk heterojunction type photoelectric conversion layer 4 having a high proportion of PCDTBT on the positive electrode side and having a high proportion of PCBM on the negative electrode side can be obtained. That is, during the period in which a mixed liquid of PCDTBT and PCBM is applied on a $MoO_3$ layer 3 and then dried, when the temperature is controlled to about 50° C. or lower, a bulk heterojunction type photoelectric conversion layer 4 having a high proportion of PCDTBT on the positive electrode side and having a high proportion of PCBM on the negative electrode side can be obtained. Meanwhile, during the period in which the mixed liquid of PCDTBT and PCBM applied on the MoO$_3$ layer 3 is dried, if the temperature of the mixed liquid increases too high, the effect of thermal disturbance becomes predominant over the mechanism of material selection at the surface of MoO$_3$ as described above, and a bulk heterojunction type photoelectric conversion layer having a uniform internal composition is formed. That is, if the temperature of the mixed liquid becomes higher than about 50° C. during the period in which the mixed liquid of PCDTBT and PCBM applied on the MoO$_3$ layer 3 is dried, a bulk heterojunction type photoelectric conversion layer having a high proportion of PCDTBT on the positive electrode side and having a high proportion of PCBM on the negative electrode side cannot be obtained.

Thereafter, a negative electrode 5 (metal electrode) is formed on the photoelectric conversion layer 4.

Then, the assembly is encapsulated in, for example, a nitrogen atmosphere, and thereby a photoelectric conversion device is completed.

Therefore, according to the photoelectric conversion device according to the present embodiment and the method for producing the same, it is advantageous in increasing the fill factor by utilizing the affinity between MoO$_3$ that is a material of the buffer layer 3 provided on the positive electrode side of the photoelectric conversion layer 4, and PCDTBT that is a p-type organic semiconductor material.

The present invention is not intended to be limited to the constitution described in the embodiment described above, and various modifications can be employed to the extent that the gist of the present invention is maintained.

For example, in the embodiment described above, the drying process is carried out after the applying process, but the present invention is not limited to this. For example, the applying process and the drying process may be carried out together (in parallel) in one process. That is, in the embodiment described above, the applied mixed liquid is dried in a process after the mixed liquid is applied; however, for example, applying and drying of the mixed liquid may be carried out together (in parallel) in one process. Furthermore, after the drying process, that is, after the mixed liquid is dried, a heat treatment at a temperature higher than 50° C. may be carried out. Thereby, the short circuit current density is increased, and thereby, the photoelectric conversion efficiency can be increased.

Furthermore, in the embodiment described above, an example of using the photoelectric conversion device in an organic thin film type solar cell is explained; however, the present invention is not intended to be limited to this, and the photoelectric conversion device can also be used in, for example, a sensor for an image device such as a camera.

EXAMPLES

Hereinafter, the present invention will be described in more detail by way of Examples. However, the present invention is not intended to be limited to the following Examples.

Example 1

In this Example 1, a photoelectric conversion device was produced as follows.

First, an ITO electrode (positive electrode) having a width of about 2 mm and a film thickness of about 200 nm was formed on a glass substrate.

Next, a MoO$_3$ buffer layer having a film thickness of about 6 nm was formed by vacuum deposition over the entire surface of the ITO electrode as a positive electrode.

Next, the glass substrate having an ITO electrode and a MoO$_3$ buffer layer formed thereon is transferred to a glove box having the inside filled with nitrogen, and a film of a monochlorobenzene solution including PCDTBT as a p-type organic semiconductor material and PCBM (in this case, [6,6]-phenyl-C$_{71}$ butyric acid methyl ester; hereinafter, referred to as PC71BM) as an n-type organic semiconductor material at a weight ratio of 1:3 (mixed solution; concentration: about 2 wt %) was formed by spin coating under the conditions of about 30° C., about 500 rpm, and about 10 seconds (applying process). After this spin coating film formation, the solution was dried by leaving to stand for about 30 minutes at about 30° C. (drying process), and thus a photoelectric conversion layer was formed.

After a photoelectric conversion layer was formed in this manner, an aluminum electrode (negative electrode) having a width of about 2 mm and a film thickness of about 150 nm was formed on the photoelectric conversion layer by vacuum deposition, without performing a heat treatment.

Then, the assembly was encapsulated in a nitrogen atmosphere, and thus a photoelectric conversion device was produced.

Figure 2:
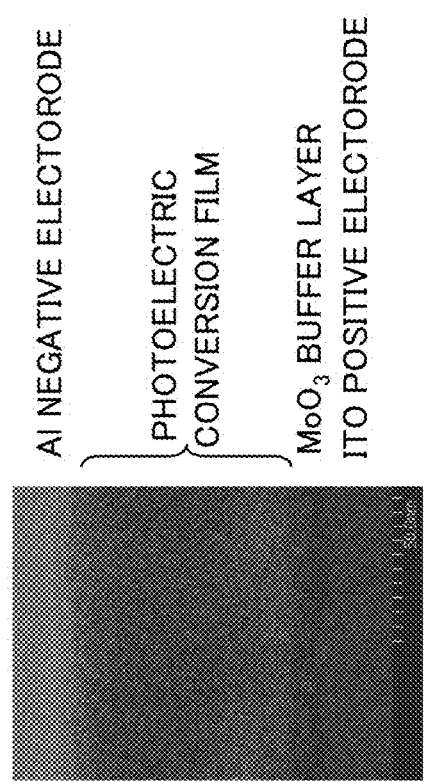
FIG. 2 is a diagram illustrating the result of performing a two-dimensional analysis by electron energy loss spectroscopy for a cross-section of the photoelectric conversion device of Example 1 and performing mapping of signals corresponding to sulfur atoms, that is, a mapping image according to electron energy loss spectroscopy directed to sulfur atoms of a cross-section of the photoelectric conversion device of Example 1.

Here, FIG. 2 illustrates the result (mapping image) of performing an analysis according to an electron energy loss spectroscopy (EELS) for a cross-section of the photoelectric conversion device of this Example 1 produced as described above, and performing mapping of the signals corresponding to sulfur atoms.

In FIG. 2, a region of the photoelectric conversion layer in the vicinity of the MoO$_3$ buffer layer appears bright, and this indicates that the signal intensity of sulfur is becoming stronger in this region.

In a photoelectric conversion device produced as described above, PCDTBT includes sulfur atoms, and PC71BM does not include sulfur atoms. Therefore, the result of the EELS analysis indicates that the concentration of PCDTBT is increasing in a region of the photoelectric conversion layer in the vicinity of the MoO$_3$ buffer layer.

Figure 3:
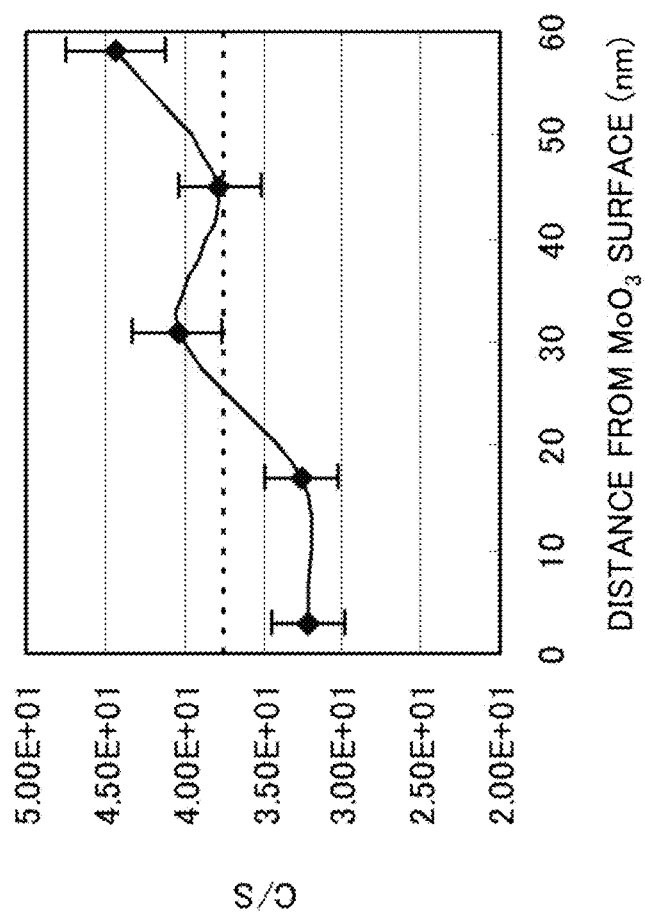
FIG. 3 is a diagram illustrating the distribution in the film thickness direction of the ratio of the signal intensity of carbon atoms and the signal intensity of sulfur atoms (EELS signal intensity ratio), which is obtained by a point analysis according to electron energy loss spectroscopy directed to sulfur atoms for a cross-section of the photoelectric conversion device of Example 1.

Furthermore, FIG. 3 illustrates the result of performing a point analysis of the interior of the photoelectric conversion layer of the photoelectric conversion device of this Example 1 produced as described above, similarly using EELS, at five points in the film thickness direction, measuring the intensity of signals attributable to sulfur atoms and the intensity of signals attributable to carbon atoms, and calculating the ratio of these intensities (signal intensity ratio; C/S). Meanwhile, in FIG. 3, an error bar indicates the standard deviation of a measurement value, and the dotted line indicates the average value of C/S. Furthermore, a position in the film thickness direction is indicated as the distance from the surface of the MoO$_3$ buffer layer.

Here, the ratio of the signal intensity of carbon atoms and the signal intensity of sulfur atoms (C/S) corresponds to the ratio of the sum of PCDTBT and PC71BM in the photoelectric conversion layer, and PCDTBT ((PC71BM+PCDTBT)/PCDTBT; weight ratio; composition ratio; mixing ratio). Furthermore, the average value of C/S corresponds to the ratio of the sum of PCDTBT and PC71BM in the mixed liquid, and PCDTBT, that is, the ratio of the sum of PCDTBT and PC71BM in the entirety of the photoelectric conversion layer, and PCDTBT (weight ratio; composition ratio; mixing ratio).

Furthermore, the proportion of PCDTBT in the mixed liquid corresponding to the average value of C/S (that is, the proportion of PCDTBT with respect to the sum of PC71BM and PCDTBT), that is, the proportion of PCDTBT in the entirety of the photoelectric conversion layer (that is, the proportion of PCDTBT with respect to the sum of PC71BM and PCDTBT), is referred to as the average proportion.

As illustrated in FIG. 3, in a region of the photoelectric conversion layer in the vicinity of the MoO₃ buffer layer, the value of C/S is smaller than the average value of C/S, that is, the proportion of PCDTBT (that is, the proportion of PCDTBT with respect to the sum of PC71BM and PCDTBT) is higher than the average proportion. Furthermore, in a region on the negative electrode side that is far from the MoO₃ buffer layer on the opposite side, the value of C/S is larger than the average value of C/S, that is, the proportion of PCDTBT (that is, the proportion of PCDTBT with respect to the sum of PC71BM and PCDTBT) is lower than the average proportion.

Figure 4:
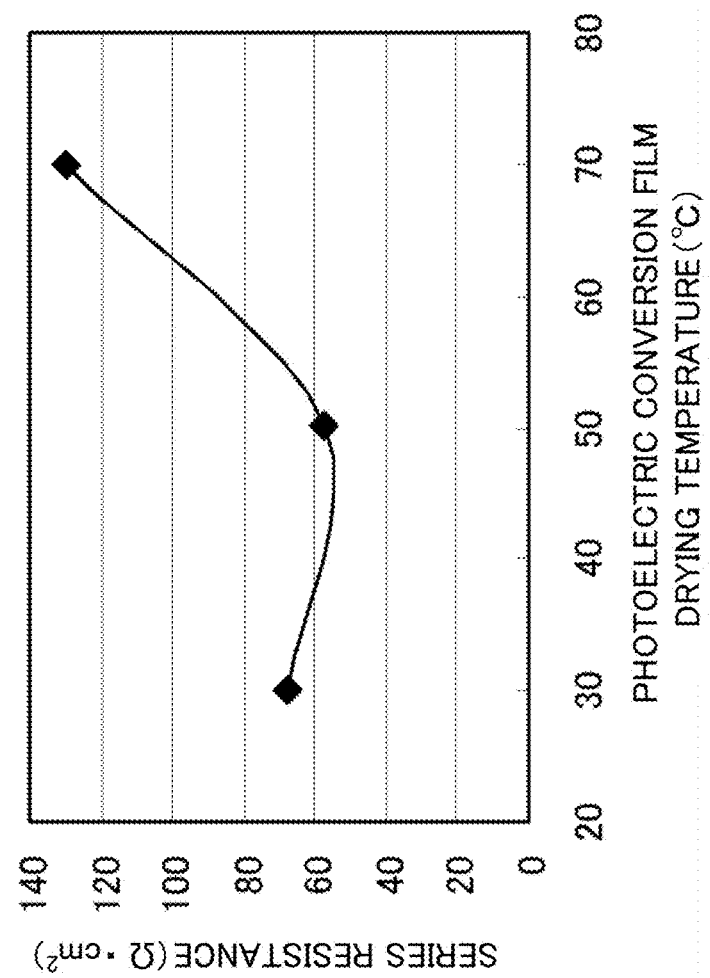
FIG. 4 is a diagram illustrating the relationship between the series resistance of a photoelectric conversion device under a solar simulator under the conditions of AM 1.5, and the drying temperature of the photoelectric conversion layer.
Figure 5:
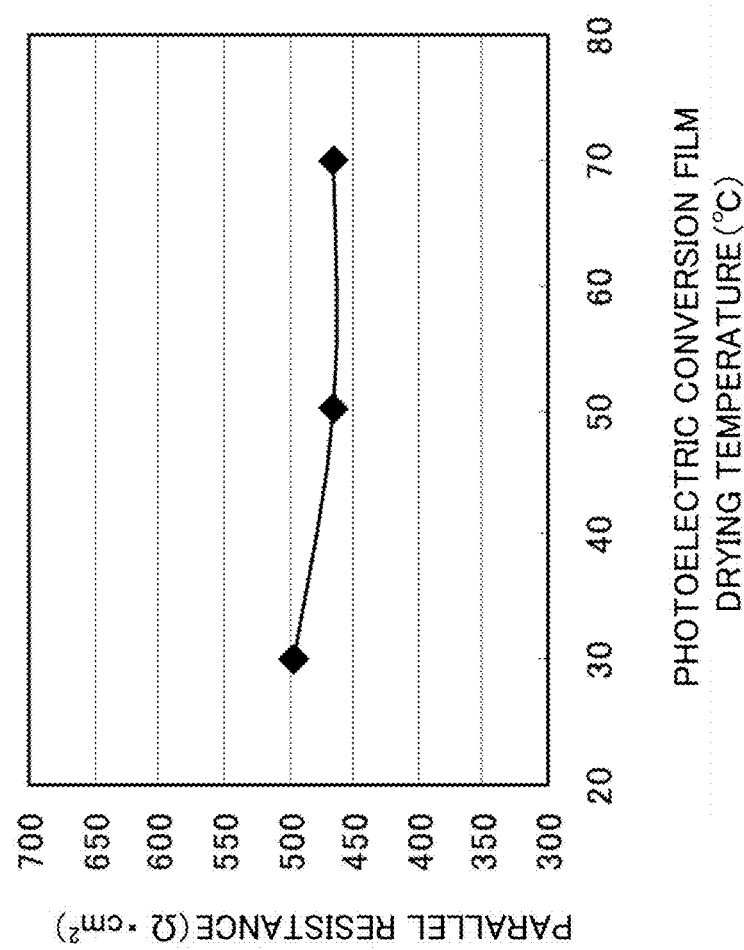
FIG. 5 is a diagram illustrating the relationship between the parallel resistance of a photoelectric conversion device under a solar simulator under the conditions of AM 1.5, and the drying temperature of the photoelectric conversion layer.

Furthermore, FIG. 4 illustrates the relationship between the drying temperature at the time of forming a photoelectric conversion layer as described above, and the series resistance. Also, FIG. 5 illustrate the relationship between the drying temperature at the time of forming a photoelectric conversion layer as described above, and the parallel resistance. Meanwhile, FIG. 4 and FIG. 5 illustrate the result of measuring the series resistance and the parallel resistance, respectively, by changing the drying temperature under the conditions of a solar simulator (AM 1.5, radiation illuminance: 100 mW/cm²), in which the series resistance and the parallel resistance can be measured with high accuracy because a large current is generated.

It is understood that when drying is performed at about 30° C. as in the case of this Example 1, as illustrated in FIG. 4 and FIG. 5, the series resistance is decreased, and the parallel resistance is increased. That is, it is understood that in the photoelectric conversion device of this Example 1 produced by performing drying at about 30° C., as described above, a structure having a high proportion of PCDTBT on the positive electrode side, that is, on the MoO₃ buffer layer side, and having a high proportion of PC71BM on the negative electrode side, is obtained, and the series resistance is decreased, while the parallel resistance is increased. Similarly, it is understood that when the drying temperature is lowered, that is, when drying is performed at a low temperature of about 50° C. or lower, the series resistance is decreased, and the parallel resistance is increased. As such, when the drying temperature is lowered, the series resistance is decreased, while the parallel resistance is increased, and as a result, the fill factor is increased. Herein, the decrease in the series resistance is more conspicuous than the increase in the parallel resistance, and this suggests that the effect of an increase in the fill factor is caused by a decrease in the conduction resistance of the carrier, that is, a decrease in the series resistance, mainly at the interface between the MoO₃ buffer layer and the negative electrode, and the photoelectric conversion layer.

Figure 6:
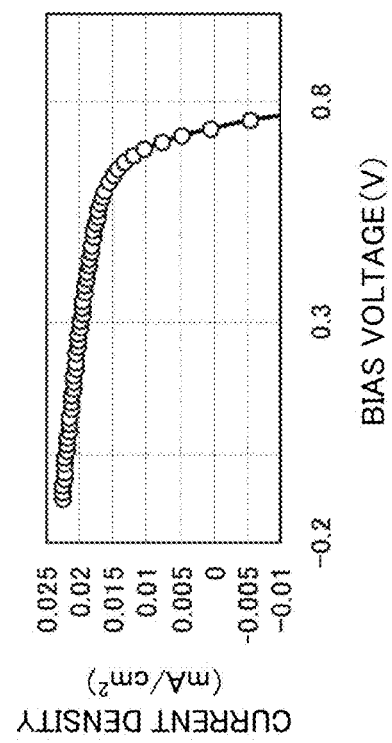
FIG. 6 is an I-V curve of the photoelectric conversion device of Example 1, obtained under white fluorescent lamp light at an illuminance of 383 Lux.

Furthermore, FIG. 6 illustrates an I-V curve of the photoelectric conversion device of this Example 1 produced as described above, obtained under white fluorescent lamp light (illuminance: 383 Lux, radiation illuminance: 88.7 µWcm²).

As illustrated in FIG. 6, under white fluorescent lamp light (illuminance: 383 Lux, radiation illuminance: 88.7 µW/cm²), the open circuit voltage (Voc) was about 0.743 V; the short circuit current density (Jsc) was about 21.8 µA/cm²; the fill factor (FF) was about 0.59; the maximum power density (Pmax) was about 9.58 µW/cm²; and the photoelectric conversion efficiency was about 10.8%. Meanwhile, the fill factor is defined as (Pmax)/(Voc×Jsc). Furthermore, the photoelectric conversion efficiency can be determined by the formula: photoelectric conversion efficiency=(Voc×Jsc×FF)/radiation illuminance of incident light×100 M.

Figure 7:
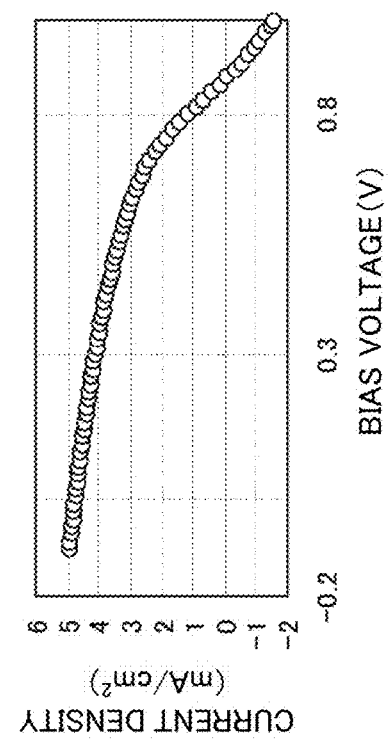
FIG. 7 is an I-V curve of the photoelectric conversion device of Example 1, obtained under a solar simulator under the conditions of AM 1.5.

Furthermore, FIG. 7 illustrates an I-V curve of the photoelectric conversion device of this Example 1 produced as described above, obtained under a solar simulator (AM (air mass): 1.5, radiation illuminance: 100 mW/cm²).

As illustrated in FIG. 7, under a solar simulator (AM (air mass): 1.5, radiation illuminance: 100 mW/cm²), the Voc was about 0.875 V, the Jsc was about 4.73 mA/cm², the FF was about 0.45, and the photoelectric conversion efficiency was about 1.85%.

To compare these with the case of the Comparative Example that will be described below, under white fluorescent lamp light, the FF increased by about 31%, and the photoelectric conversion efficiency increased by about 82%. Under a solar simulator, the FF increased by about 25%, and the photoelectric conversion efficiency increased by about 80%. That is, in regard to the drying process, when the case of performing drying by leaving to stand for about 30 minutes at about 30° C. is compared with the case of performing a heated drying treatment for about 10 minutes at about 70° C., under white fluorescent lamp light, the FF increased by about 31%, and the photoelectric conversion efficiency increased by about 82%. Under a solar simulator, the FF increased by about 25%, and the photoelectric conversion efficiency increased by about 80%. As such, when drying was performed at a low temperature of about 50° C. or lower, as described above, a structure having a high proportion (concentration) of PCDTBT on the positive electrode side, that is, on the MoO₃ buffer layer side, and having a high proportion (concentration) of PC71BM on the negative electrode side was obtained. Under white fluorescent lamp light, the FF increased by about 31%, and the photoelectric conversion efficiency increased by about 82%; and under a solar simulator, the FF increased by about 25%, and the photoelectric conversion efficiency increased by about 80%.

Comparative Example

In the present Comparative Example, a photoelectric conversion device was produced by the same method as that used in Example 1 described above, except for the drying process, that is, except that after the film forming by spin coating, a heated drying treatment for about 10 minutes was carried out at about 70° C.

Figure 8:
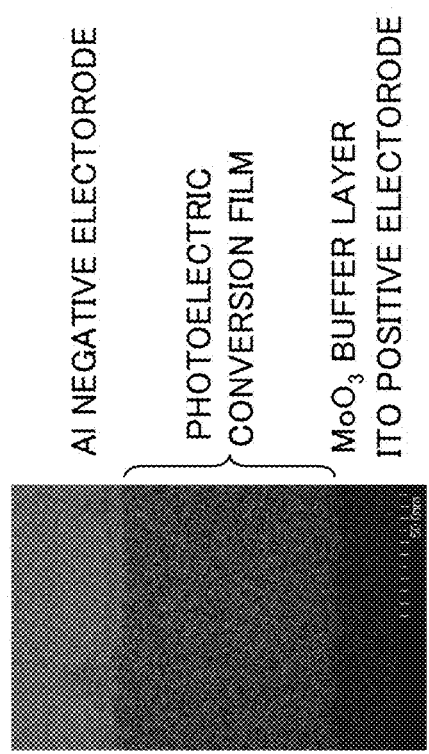
FIG. 8 is a diagram illustrating the result of performing a two-dimensional analysis of electron energy loss spectroscopy for a cross-section of the photoelectric conversion device of Comparative Example 1 and performing mapping of signals corresponding to sulfur atoms, that is, a mapping image according to electron energy loss spectroscopy directed to sulfur atoms of a cross-section of the photoelectric conversion device of Comparative Example 1.

Here, FIG. 8 illustrates the result (mapping image) of performing an analysis according to electron energy loss spectroscopy for a cross-section of the photoelectric conversion device of this Comparative Example produced as described above, and performing mapping of the signals corresponding to sulfur atoms.

In FIG. 8, the brightness of the photoelectric conversion layer is uniform, and this implies that the concentration of sulfur atoms, that is, the concentration of PCDTBT, is almost uniform. This indicates that when drying is carried out under heated conditions, uniformization of the composition by thermal disturbance has proceeded.

Figure 9:
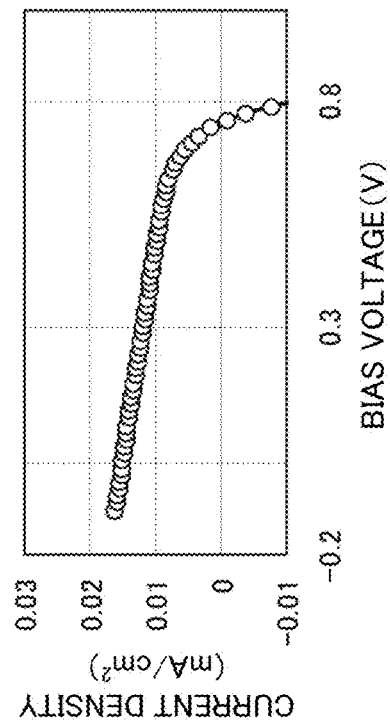
FIG. 9 is an I-V curve of the photoelectric conversion device of Comparative Example 1, obtained under white fluorescent lamp light at an illuminance of 375 Lux.

Furthermore, FIG. 9 illustrates an I-V curve of the photoelectric conversion device of this Comparative Example produced in this manner, obtained under white fluorescent lamp light (illuminance: 375 Lux, radiation illuminance: 84.9 µW/cm²).

As illustrated in FIG. 9, the Voc was about 0.751 V, the Jsc was about 15.0 µA/cm$^2$, the FF was about 0.45, and the photoelectric conversion efficiency was about 5.93%.

Figure 10:
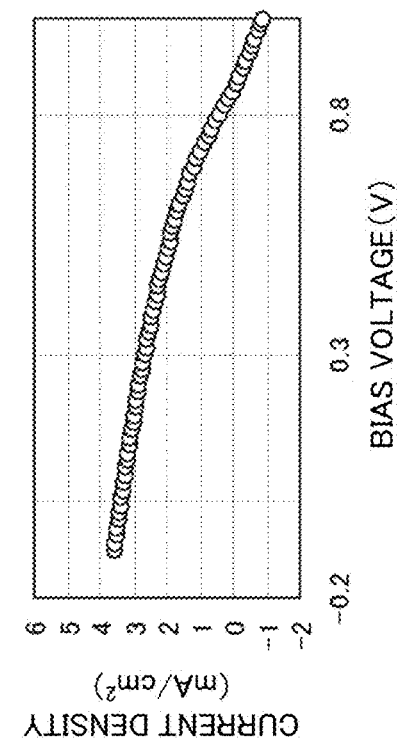
FIG. 10 is an I-V curve of the photoelectric conversion device of Comparative Example 1, obtained under a solar simulator under the conditions of AM 1.5.

Furthermore, FIG. 10 illustrates an I-V curve of the photoelectric conversion device of this Comparative Example produced as described above, obtained under a solar simulator (AM 1.5, radiation illuminance: 100 mW/cm$^2$).

As illustrated in FIG. 10, the Voc was about 0.853 V, the Jsc was about 3.35 mA/cm$^2$, the FF was about 0.36, and the photoelectric conversion efficiency was about 1.03%.

Example 2

In this Example 2, a photoelectric conversion device was produced by the same method as that used in Example 1 described above, except for the drying process, that is, except that after the film forming by spin coating, a heated drying treatment for about 10 minutes was carried out at about 50° C.

Figure 11:
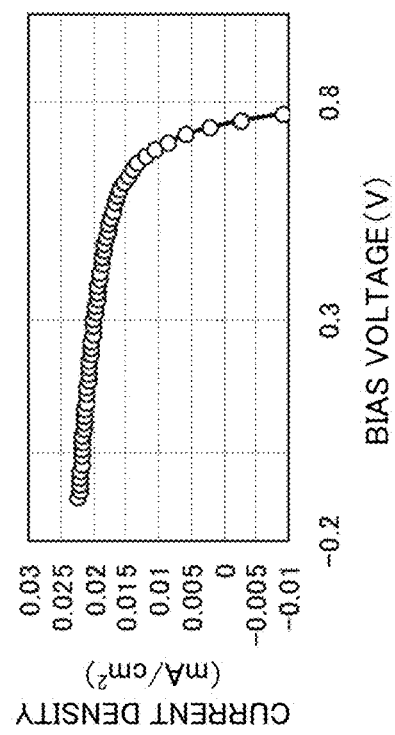
FIG. 11 is an I-V curve of the photoelectric conversion device of Example 2, obtained under white fluorescent lamp light at an illuminance of 375 Lux.

Here, FIG. 11 illustrates an I-V curve of the photoelectric conversion device of this Example 2 produced as described above, obtained under white fluorescent lamp light (illuminance: 375 Lux, radiation illuminance: 84.9 µW/cm$^2$).

As illustrated in FIG. 11, the Voc was about 0.748 V, the Jsc was about 21.6 µA/cm$^2$, the FF was about 0.59, and the photoelectric conversion efficiency was about 11.1%.

Figure 12:
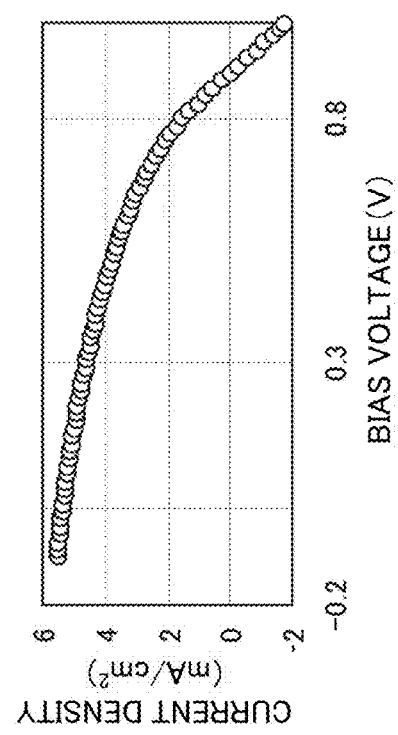
FIG. 12 is an I-V curve of the photoelectric conversion device of Example 2, obtained under a solar simulator under the conditions of AM 1.5.

Furthermore, FIG. 12 illustrates an I-V curve of the photoelectric conversion device of this Example 2 produced as described above, obtained under a solar simulator (AM 1.5, radiation illuminance: 100 mW/cm$^2$).

As illustrated in FIG. 12, the Voc was about 0.897 V, the Jsc was about 5.32 mA/cm$^2$, the FF was about 0.41, and the photoelectric conversion efficiency was about 1.97%.

As such, the FF and the photoelectric conversion efficiency were equivalent to those in the case of Example 1 described above. That is, in regard to the drying process, even if a heated drying treatment for about 10 minutes at about 50° C. is performed instead of drying by leaving to stand for about 30 minutes at about 30° C., FF and photoelectric conversion efficiency values equivalent to those in the case of Example 1 described above was obtained. Thus, it was found that as such, when drying is carried out at a low temperature of about 50° C. or lower, the FF and the photoelectric conversion efficiency increase, as in the case of Example 1 described above.

Example 3

In this Example 3, a photoelectric conversion device was produced by the same method as that used in Example 1 described above, except that the applying process and the drying process were carried out together in a single process, that is, film forming was performed by spin coating for a spinning time of about 5 minutes at about 30° C., and the photoelectric conversion layer was allowed to dry during the film forming by spin coating.

Figure 13:
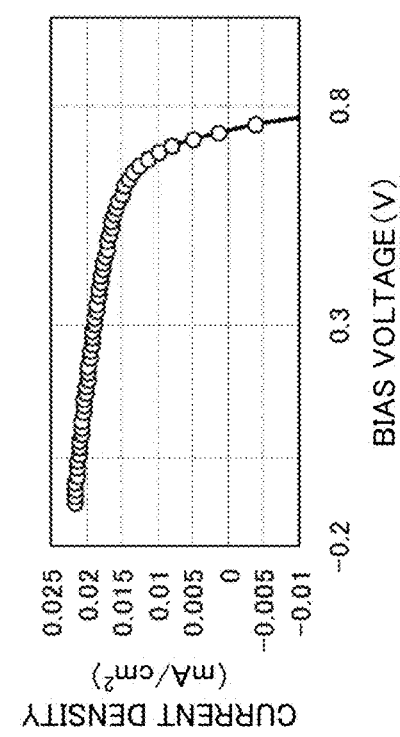
FIG. 13 is an I-V curve of the photoelectric conversion device of Example 3, obtained under white fluorescent lamp light at an illuminance of 375 Lux.

Here, FIG. 13 illustrates an I-V curve of the photoelectric conversion device of this Example 3 produced as described above, obtained under white fluorescent lamp light (illuminance: 375 Lux, radiation illuminance: 84.9 µW/cm$^2$).

As illustrated in FIG. 13, the Voc was about 0.746 V, the Jsc was about 20.9 µA/cm$^2$, the FF was about 0.57, and the photoelectric conversion efficiency was about 10.3%.

Figure 14:
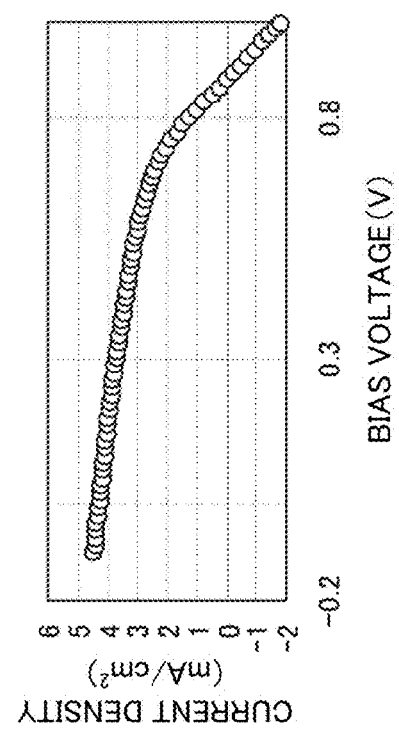
FIG. 14 is an I-V curve of the photoelectric conversion device of Example 3, obtained under a solar simulator under the conditions of AM 1.5.

Furthermore, FIG. 14 illustrates an I-V curve of the photoelectric conversion device of this Example 3 produced as described above, obtained under a solar simulator (AM 1.5, radiation illuminance: 100 mW/cm$^2$).

As illustrated in FIG. 14, the Voc was about 0.880 V, the Jsc was about 4.25 mA/cm$^2$, the FF was about 0.46, and the photoelectric conversion efficiency was about 1.72%.

As such, even if the film forming by spin coating (applying) and the drying were carried out simultaneously (in parallel), the FF and the photoelectric conversion efficiency were equivalent to those in the case of Example 1 described above. That is, in regard to the applying process and the drying process, even if film forming by spin coating was performed for a spinning time of about 5 minutes at about 30° C., and the photoelectric conversion layer was allowed to dry during the film formation by spin coating, instead of performing film forming by spin coating under the conditions of about 30° C., about 500 rpm and about 10 seconds and subsequently drying by leaving to stand for about 30 minutes at about 30° C., FF and photoelectric conversion efficiency values equivalent to those in the case of Example 1 described above were obtained. It was found that as such, when applying and drying are carried out at a low temperature of about 50° C. or lower, the FF and the photoelectric conversion efficiency are increased similarly to the case of Example 1 described above.

Example 4

In this Example 4, a photoelectric conversion device was produced by the same method as that used in Example 1 described above, except that after the drying process, a heat treatment was carried out at a temperature higher than about 50° C., that is, after the drying process, a heat treatment was carried out for about 10 minutes at about 70° C.

Figure 15:
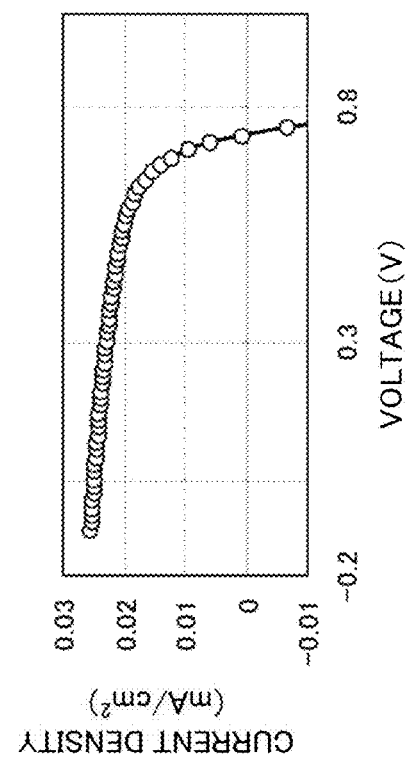
FIG. 15 is an I-V curve of the photoelectric conversion device of Example 4, obtained under white fluorescent lamp light at an illuminance of 382 Lux.

Here, FIG. 15 illustrates an I-V curve of the photoelectric conversion device of this Example 4 produced as described above, obtained under white fluorescent lamp light (illuminance: 382 Lux, radiation illuminance: 88.3 µW/cm$^2$).

As illustrated in FIG. 15, the Voc was about 0.743 V, the Jsc was about 24.8 µA/cm$^2$, the FF was about 0.61, and the photoelectric conversion efficiency was about 12.6%.

Figure 16:
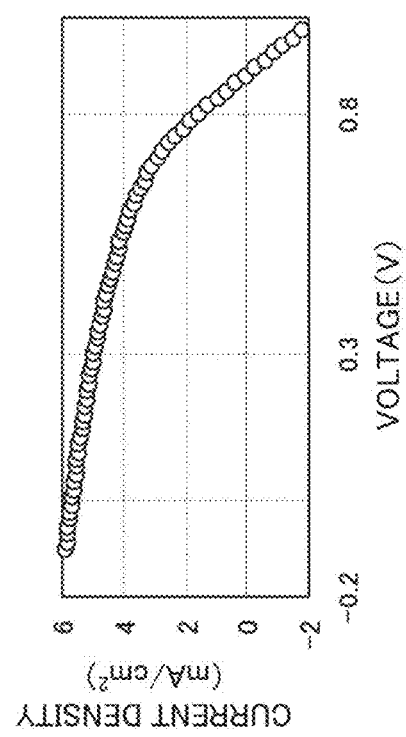
FIG. 16 is an I-V curve of the photoelectric conversion device of Example 4, obtained under a solar simulator under the conditions of AM 1.5.

Furthermore, FIG. 16 illustrates an I-V curve of the photoelectric conversion device of this Example 4 produced as described above, obtained under a solar simulator (AM 1.5, radiation illuminance: 100 mW/cm$^2$).

As illustrated in FIG. 16, the Voc was about 0.884 V, the Jsc was about 5.65 mA/cm$^2$, the FF was about 0.45, and the photoelectric conversion efficiency was about 2.26%.

It was found that as such, when a heat treatment is carried out at a temperature higher than about 50° C. after the drying process, the Jsc is increased as compared with the case of Example 1 described above, and as a result, the photoelectric conversion efficiency is increased. This is speculated to be a result obtained when the photoelectric conversion layer is subjected to a heat treatment after the drying process, PC71BM becomes more dense, and the conductivity of electrons is increased.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that the various changes, substitutions, and alterations could be made hereto without departing from the spirit and scope of the invention.

What is claimed is:

1. A photoelectric conversion device comprising:
a positive electrode;
a negative electrode;
a photoelectric conversion layer including poly-[N-9"-heptadecanyl-2,7-carbazole-alt-5,5-(4',7'-di-2-thienyl-2',1',3'-benzothiadiazole)] as a p-type organic semiconductor material and including fullerene or a fullerene derivative as an n-type organic semiconductor material; and
a buffer layer, provided between the positive electrode and the photoelectric conversion layer, including $MoO_3$,
wherein the p-type organic semiconductor material and the n-type organic semiconductor material are in a mixed state over the entirety of the photoelectric conversion layer, and the proportion of the p-type organic semiconductor material in a first region, which is directly in contact with a surface of the buffer layer and extending within the photoelectric conversion layer, is higher than the proportion of the p-type organic semiconductor material in the entirety of the photoelectric conversion layer, and the proportion of the p-type organic semiconductor material in a second region, which is directly in contact with a surface of the negative electrode and extending within the photoelectric conversion layer, is lower than the proportion of the p-type organic semiconductor material in the entirety of the photoelectric conversion layer.

2. The photoelectric conversion device according to claim 1, wherein the n-type organic semiconductor material includes any one material selected from the group consisting of [6,6]-phenyl-$C_{71}$ butyric acid methyl ester, [6,6]-phenyl-$C_{61}$ butyric acid methyl ester, fullerene C60, C70 or C84, indene-C 60 bisadduct, [6,6] diphenyl $C_{62}$bis(butyric acid methyl ester), [6,6] diphenyl $C_{72}$bis(butyric acid methyl ester), [6,6]-phenyl-$C_{61}$ butyric acid (3-ethylthiophene) ester, 1-(3-methoxycarbonyl)propyl-1-thienyl-[6,6]-methanofullerene, and [6,6]-phenyl-$C_{61}$ butyric acid (2,5-dibromo-3-ethylthiophene) ester.

* * * * *